US008539196B2

(12) United States Patent
Roy

(10) Patent No.: US 8,539,196 B2
(45) Date of Patent: Sep. 17, 2013

(54) HIERARCHICAL ORGANIZATION OF LARGE MEMORY BLOCKS

(75) Inventor: Richard S. Roy, Dublin, CA (US)

(73) Assignee: MoSys, Inc., Santa Clara, CA (US)

(*) Notice: Subject to any disclaimer, the term of this patent is extended or adjusted under 35 U.S.C. 154(b) by 863 days.

(21) Appl. No.: 12/697,132

(22) Filed: Jan. 29, 2010

(65) Prior Publication Data
US 2011/0191564 A1 Aug. 4, 2011

(51) Int. Cl.
G06F 12/00 (2006.01)

(52) U.S. Cl.
USPC .................. 711/173; 711/5; 711/E12.001

(58) Field of Classification Search
USPC ..................... 711/5, 173, E12.001
See application file for complete search history.

(56) References Cited

U.S. PATENT DOCUMENTS

| 6,854,041 | B2 | 2/2005 | Covino et al. | |
|---|---|---|---|---|
| 6,944,728 | B2 | 9/2005 | Calderon et al. | |
| 2003/0117885 | A1* | 6/2003 | Hasegawa et al. | 365/233 |
| 2004/0215903 | A1* | 10/2004 | Barri et al. | 711/148 |

OTHER PUBLICATIONS

Micron Technology, Inc., SIO RLDRAM II Features data sheet, Jun. 2009, pp. 1-74, published by Micron Technology, Inc., Boise, Idaho.

* cited by examiner

Primary Examiner — Larry Mackall
(74) Attorney, Agent, or Firm — Bever, Hoffman & Harms, LLP

(57) ABSTRACT

A multi-bank memory system includes one or more levels of logical memory hierarchy to increase the available random cyclic transaction rate of the memory system. The memory system includes a plurality of multi-bank partitions, each having a corresponding partition interface. Each partition interface accesses the corresponding multi-bank partition at a first frequency. A global interface may access the partition interfaces at a second frequency, which is equal to the first frequency times the number of partition interfaces. Alternately, a plurality of cluster interfaces may access corresponding groups of the partition interfaces, wherein each cluster interface accesses the corresponding group of partition interfaces at a second frequency that is faster than the first frequency. A global interface accesses the cluster interfaces at a third frequency that is greater than the second frequency.

18 Claims, 14 Drawing Sheets

HIERARCHICAL ORGANIZATION OF LARGE MEMORY BLOCKS

FIELD OF THE INVENTION

The present invention relates to a memory system that adds one or more levels of logical memory hierarchy to a multi-bank memory structure to multiply the available cyclic random bandwidth of the memory system.

RELATED ART

Conventional memory systems include multiple banks to increase the available cyclic random bandwidth. This increases the available transaction generation frequency by the number of banks included in the memory system. However, there are diminishing returns as the number of banks continues to increase, due to increased area and decoding load, which limits the maximum operating frequency of the memory system.

FIG. 1 is a block diagram of a conventional memory system 100 that is organized as a single bank. Memory system 100 includes a dynamic random access memory (DRAM) array 101 having an exemplary capacity of 576 Mbits. Address generation/data input block 102 generates the row/column address for each access to array 101, and provides the write data for write accesses to array 101. Read data is provided at data output block 103. One access may be performed during each cycle. The cycle time is limited by the bit line (row) cycle time of array 101. In the illustrated example, the bit line (row) cycle time of array 101 is 30 nanoseconds (ns), such that memory system 100 has a 33 MHz random access transaction rate.

FIG. 2A is a block diagram of a conventional reduced-latency DRAM (RLDRAM) memory system 200 that includes multiple banks. More specifically, memory system 200 includes banks 201-208, which include DRAM arrays 211-218, respectively, address generation/data input blocks 221-228, respectively, and data output blocks 231-238, respectively. Memory system 200 also includes a common interface 240, which includes global address generation/data input block 241 and global data output block 242. Each of the DRAM arrays 211-218 has an exemplary capacity of 72 Mbits (such that memory systems 100 and 200 have the same capacity). Again, the cycle time of each of the memory banks 201-208 is limited by the bit line (row) cycle time of the corresponding DRAM arrays 211-218. Because DRAM arrays 211-218 have shorter bit lines than DRAM array 101, the bit line (row) cycle time of DRAM arrays 211-218 is shorter than the bit line (row) cycle time of DRAM array 101. In the described example, the bit line (row) cycle time of DRAM arrays 211-218 is 15 ns, such that each of the DRAM arrays has a 67 MHz random access transaction rate.

Common interface 240 may access banks 201-208 in a cyclic manner at a frequency of about 533 MHz (i.e., 533 M transactions/second). For example, global address generation block 241 may transmit access addresses that sequentially access banks 201-208, at a frequency of 533 MHz.

FIG. 2B is a waveform diagram illustrating the operation of memory system 200. Global address generation/data input block 241 transmits read addresses A1-A9 on address bus 251 during cycles C1-C9. Read addresses A1-A8 specify random entries within memory banks 201-208, respectively, and read address A9 specifies a random entry within memory bank 201. After an initial delay of 15 ns, data value D1 is read from bank 201 onto data bus 252 during cycle C9. Thereafter, data values D2-D8 are read from banks 202-208, respectively, during cycles C10-C16, respectively. During cycle C17, the data value D9 is read from bank 201. Note that 15 ns (i.e., the bit line (row) cycle time) properly exists between the reading of data values D1 and D9 from bank 201.

FIG. 3 is a block diagram of another conventional memory system 300 that includes multiple banks. More specifically, memory system 300 includes 128 banks $B_0$-$B_{127}$, each of which includes a DRAM array, an address generation/data input block, and a data output block. Memory system 300 also includes a common interface 301, which includes global address generation/data input block 302 and global data output block 303. Each of the banks $B_0$-$B_{127}$ has an exemplary capacity of 4.5 Mbits (such that memory systems 100, 200 and 300 have the same capacity). Again, the cycle time of each of the memory banks $B_0$-$B_{127}$ is limited by the bit line (row) cycle time of the corresponding DRAM arrays. The DRAM arrays of memory banks $B_0$-$B_{127}$ have shorter bit lines than DRAM arrays 201-208, such that the bit line (row) cycle time of memory banks $B_0$-$B_{127}$ is shorter than the bit line (row) cycle time of DRAM arrays 211-218. In the described example, the bit line (row) cycle time of memory banks $B_0$-$B_{127}$ is 4 ns, such that each of the DRAM arrays has a 250 MHz random access transaction rate.

Memory system 300 implements a common interface 301 to all 128 memory banks $B_0$-$B_{127}$, wherein this common interface 301 is distributed throughout the entire chip.

Common interface 301 is capable of accessing memory banks $B_0$-$B_{127}$ in a random manner, such that the random access transaction rate of memory system 300 is 250 MHz. The common interface 301 includes numerous repeaters (not shown), which are distributed throughout the chip, thereby allowing signals to be transmitted between address generation/data input block 302/data output block 303 and the memory banks $B_0$-$B_{127}$. These repeaters consume both layout area and power. The large common interface 301 to all 128 banks $B_0$-$B_{127}$ imposes a 250 MHz practical limit (250 M transactions per second) on memory system 300.

It would be desirable to have a memory system capable of operating at higher cyclic random transaction rates.

SUMMARY

Accordingly, the present invention provides a multi-bank memory system that includes one or more levels of logical memory hierarchy. In accordance with one embodiment, a first level of memory hierarchy includes partitions, which are formed by a plurality of memory banks, and a second level of memory hierarchy includes clusters, which are formed by a plurality of partitions.

The memory system includes a plurality of partitions, each including a plurality of memory banks coupled to a common local bus system. Each of the partitions is coupled to a corresponding partition interface. Each partition interface accesses the corresponding multi-bank partition at a first frequency on the corresponding local bus system. The first frequency may be equal to or greater than the access frequency of an individual memory bank.

In one embodiment, a global interface accesses the partition interfaces in a cyclic manner at a second frequency, which is faster than the first frequency. More specifically, the second frequency is equal to the first frequency times the number of partition interfaces.

In an alternate embodiment, a plurality of cluster interfaces access corresponding groups of the partition interfaces, wherein each cluster interface accesses a corresponding group of partition interfaces in a cyclic manner at a second frequency, which is faster than the first frequency. A global interface accesses the cluster interfaces in a cyclic manner at a third frequency, which is greater than the second frequency.

The hierarchical structure of the multi-bank memory system of the present invention advantageously increases the available random cyclic transaction rate of the memory system, while maintaining a relatively low access frequency within the individual memory banks and area overhead of the memory system.

The present invention will be more fully understood in view of the following description and drawings.

DETAILED DESCRIPTION

In general, the present invention includes the addition of one or more levels of logical memory hierarchy to a multi-bank memory system in order to increase the available random cyclic transaction rate of the memory system. Adding an additional level of hierarchy (partition) multiplies the available cyclic random bandwidth by the number of partitions. Multiple banks may operate concurrently within each partition at a relatively low speed. The addition of a further level of hierarchy (cluster) above the partition allows for a further increase in the cyclic random transaction rate without increasing the frequency of operation of the banks or partitions.

Figure 4:
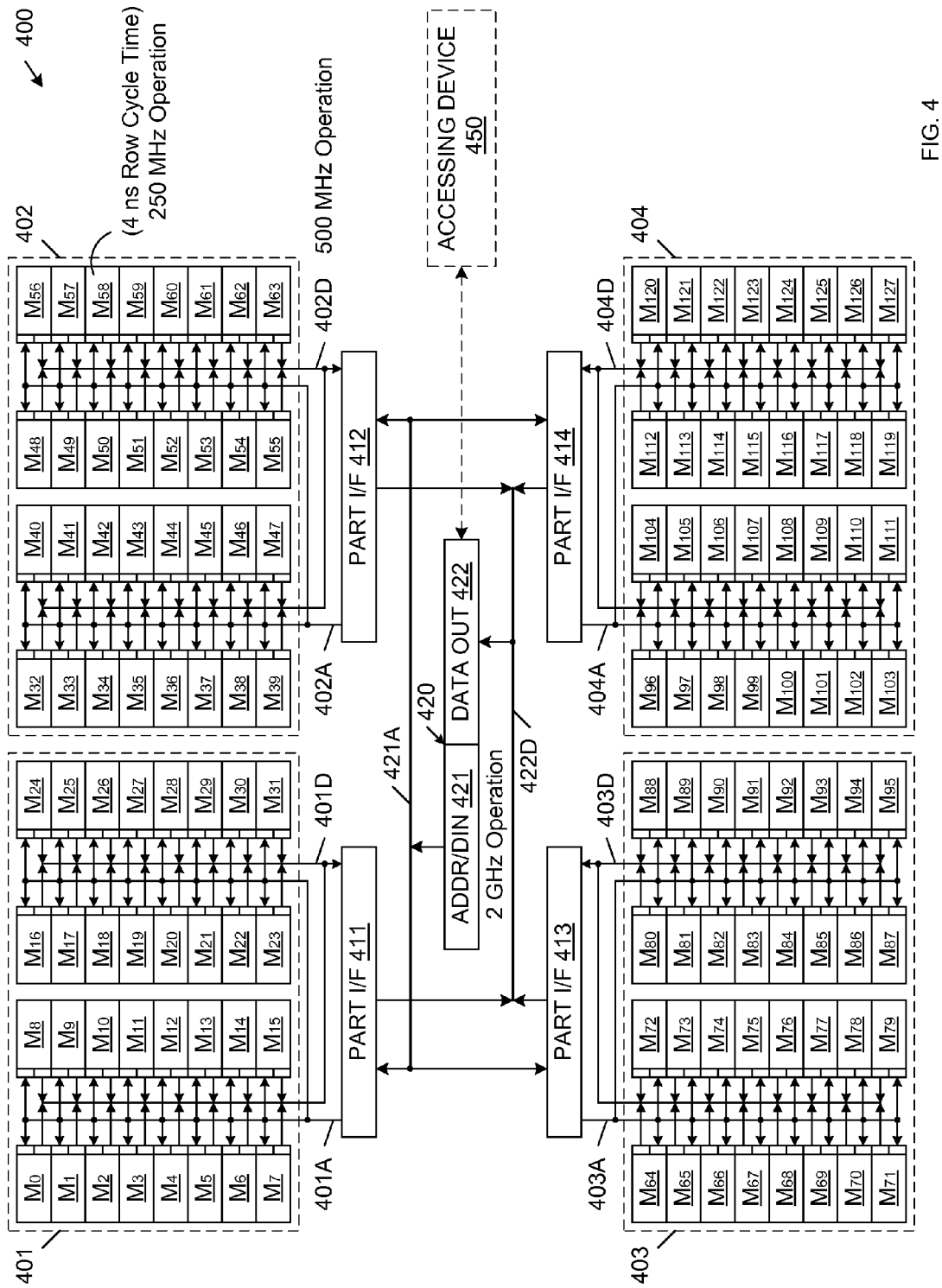
FIG. 4 is a block diagram of a memory system that includes one level of hierarchy in accordance with one embodiment of the present invention.

FIG. 4 is a block diagram of a memory system 400 in accordance with one embodiment of the present invention. Memory system 400 includes multi-bank partitions 401-404, partition interfaces 411-414, and global interface 420. Multi-bank partitions 401, 402, 403 and 404 include memory banks $M_0$-$M_{31}$, $M_{32}$-$M_{63}$, $M_{64}$-$M_{95}$ and $M_{96}$-$M_{127}$, respectively. Although the example of FIG. 4 includes four multi-bank partitions, each having 32 memory banks, it is understood that other embodiments may include other numbers of multi-bank partitions, wherein each partition may include other numbers of memory banks.

In the described examples, each of memory banks $M_0$-$M_{127}$ includes a 4.5 Mbit DRAM array that has a 4 ns row cycle time. That is, each of memory banks $M_0$-$M_{127}$ operates at a frequency of 250 MHz (i.e., 250 M transactions/sec). Each of the memory banks $M_0$-$M_{127}$ includes an address generation/data input block that is coupled to a local address/write data bus, and a data output block that is coupled to a local read data bus. More specifically, the address generation/data input blocks of the memory banks in multi-bank partitions 401, 402, 403 and 404 are coupled to local address/write data buses 401A, 402A, 403A and 404A, respectively. These local address/write data buses transmit read and write access addresses to the memory banks. These local address/write data buses also transmit write data values (for write accesses) to the memory banks. Although not specifically illustrated, it is understood that each of the local address/write data buses include one set of lines for carrying the read/write access addresses, and another set of lines for carrying the write data values. The data output blocks of the memory banks in multi-bank partitions 401, 402, 403 and 404 are coupled to local read data buses 401D, 402D, 403D and 404D, respectively. These local read data buses transmit read data values (for read accesses) from the memory banks. As described in more detail below, the local address/write data buses and the local read data buses 401A-404A and 401D-404D are operated a frequency of 500 MHz (i.e., 2 times the frequency of memory banks $M_0$-$M_{127}$).

Partition interfaces 411-414 are coupled to multi-bank partitions 401-404, respectively, by the local address/write data buses 401A-404A, respectively, and the local read data buses 401D-404D, respectively. Partition interfaces 411-414 are also coupled to global interface 420 by a global address/write data bus 421A and a global read data bus 422D. The global address/write data bus 421A is coupled to address/write data generation block 421, and the global read data bus 422D is coupled to data output block 422. In the described examples, global address/write data bus 421A and global read data bus 422D operate at frequency of 2 GHz (i.e., 4 times the frequency of local buses 401A-404A and 401D-404D).

Memory system 400 is accessed by an external accessing device 450 at a frequency of 2 GHz. As described in more detail below, accessing device 450 accesses multi-bank partitions 401-404 in a cyclic random manner. That is, accessing device 450 accesses each of the multi-bank partitions 401-404 (at most) once every four cycles of a 2 GHz clock signal.

Figure 5:
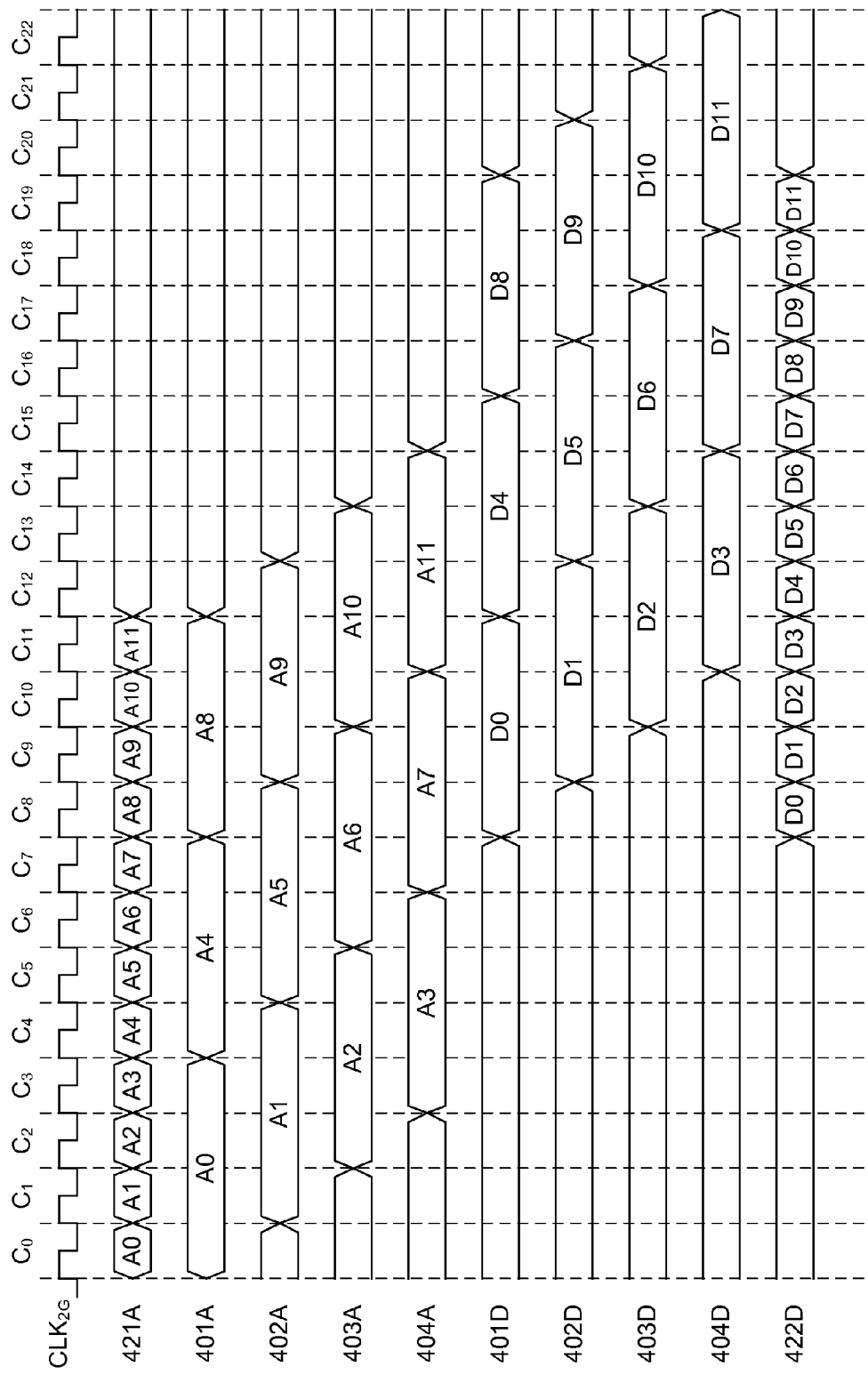
FIG. 5 is a waveform diagram illustrating the operation of the memory system of FIG. 4 in accordance with one embodiment of the present invention.

FIG. 5 is a waveform diagram illustrating the operation of memory system 400 in accordance with one embodiment of the present invention. While the waveform diagram of FIG. 5 illustrates cyclic random read transactions, it is understood that cyclic random write transactions could alternately be performed to memory system 400.

Global address/write data generation block 421 provides read addresses A0-A11 on global address bus 421A during corresponding cycles $C_0$-$C_{12}$ of a 2 GHz clock signal, $CLK_{2G}$. Read addresses A0, A1, A2 and A3 specify memory banks within multi-bank partitions 401, 402, 403 and 404, respectively. Partition interfaces 411, 412, 413 and 414 determine that read addresses A0, A1, A2 and A3 target the corresponding multi-bank partitions 401, 402, 403 and 404, respectively, and in response, transmit the read addresses A0, A1, A2 and A3 on the corresponding local address/write data buses 401A, 402A, 403A and 404A, starting during cycles C0, C1, C2 and C3, respectively. Although partition interfaces 411-414 do not exhibit any signal delay in FIG. 5 for purposes of clarity, it is understood that some signal delay will typically introduced by partition interfaces 411-414.

Upon receiving the read addresses A0, A1, A2 and A3, the memory banks specified by these read addresses perform read operations. As described above, each of the memory banks $M_0$-$M_{127}$ has a row cycle time of 4 ns, so the associated read data values D0, D1, D2 and D3 are provided on local data output buses 401D, 402D, 403D and 404D, starting during cycles $C_8$, $C_9$, $C_{10}$ and $C_{11}$, respectively.

Read addresses A4, A5, A6 and A7 specify memory banks within multi-bank partitions 401, 402, 403 and 404, respectively. The memory banks specified by read addresses A4-A7 are different than the memory banks specified by read addresses A0-A3. In the present embodiment, successive accesses to each multi-bank partition must specify different memory banks within the partition. As described below, this allows successive overlapping accesses to be performed within each partition, thereby allowing the local address and data buses to operate at twice the frequency of the memory banks. Partition interfaces 411, 412, 413 and 414 determine that read addresses A4, A5, A6 and A7 target the corresponding partitions 401, 402, 403 and 404, respectively, and in response, transmit the read addresses A4, A5, A6 and A7 on the corresponding local address/write data buses 401A, 402A, 403A and 404A, starting during cycles $C_4$, $C_5$, $C_6$ and $C_7$, respectively.

Upon receiving the read addresses A4, A5, A6 and A7, the memory banks specified by these read addresses perform read operations, such that the associated read data values D4, D5, D6 and D7 are provided on local read data output buses 401D, 402D, 403D and 404D, starting during cycles $C_{12}$, $C_{13}$, $C_{14}$ and $C_{15}$, respectively.

Note that the read accesses may partially overlap within each partition. For example, within partition 401, the read access specified by read address A0 overlaps the read access specified by read address A4. This allows the local address and data buses 401A and 401D to operate at a frequency of 500 MHz, while each of the memory banks $M_0$-$M_{31}$ operates at a frequency of 250 MHz. Because successive accesses to the same partition may partially overlap, successive accesses to the same partition must access different banks within the partition. This rule is typically enforced by global address/write data generation block 421 and/or accessing device 450.

Read addresses A8-A11 specify memory banks within partitions 401-404, respectively. Again, read addresses A8-A11 specify different memory banks than addresses A4-A7. Partition interfaces 411-414 transmit the read addresses A8-A11 to local address/write data buses 401A-404A, respectively, and associated read data values D8-D11 are subsequently provided on local read data buses 401D-404D, respectively, starting during cycles $C_{16}$-$C_{19}$, respectively.

Partition interfaces 411-414 receive the read data values provided on local read data buses 401D-404D. Upon receiving a new data value, each partition interface provides this new data value on the global read data bus 422D for one cycle of the global clock signal $CLK_{2G}$. In the described example, partition interface 411 provides the read data values D0, D4 and D8 on global read data bus 422D during cycles $C_8$, $C_{12}$ and $C_{16}$, respectively; partition interface 402 provides the read data values D1, D5 and D9 on global read data bus 422D during cycles $C_9$, $C_{13}$ and $C_{17}$, respectively; partition interface 403 provides the read data values D2, D6 and D10 on global read data bus 422D during cycles $C_{10}$, $C_{14}$ and $C_{18}$, respectively; and partition interface 404 provides the read data values D3, D7 and D11 on global read data bus 422D during cycles $C_{11}$, $C_{15}$ and $C_{19}$, respectively. In this manner, the read data values D0-D11 are provided on the global read data bus 422D at a frequency of 2 GHz. Data output block 422 receives the read data values from global data bus 422D, and provides these read data values to the accessing device 450 (at 2 GHz).

Although FIG. 5 only shows three cycles of accessing partitions 401-404, it is understood that partitions 401-404 could be continually accessed in the cyclic manner illustrated by FIG. 5.

Figure 1:
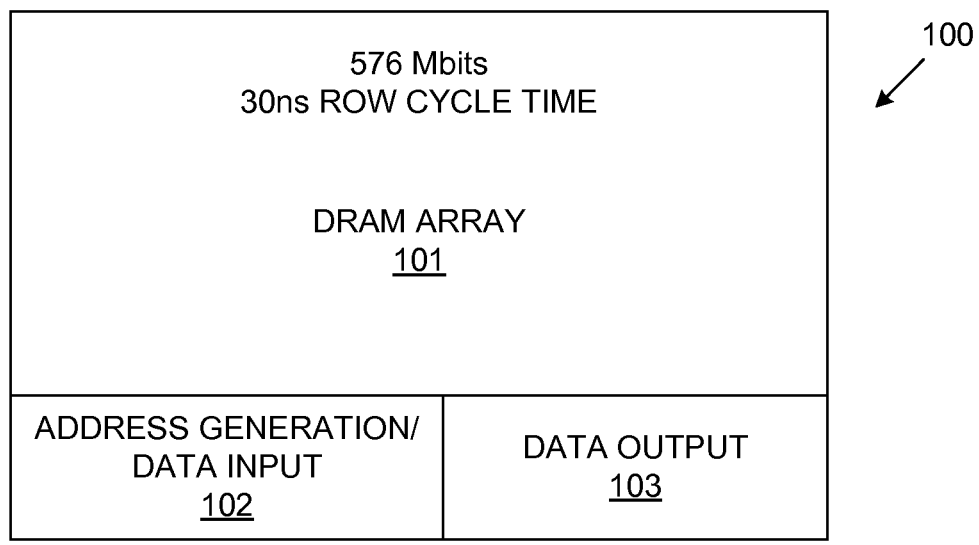
FIG. 1 is a block diagram of a conventional memory system that is organized as a single bank.
Figure 2A:
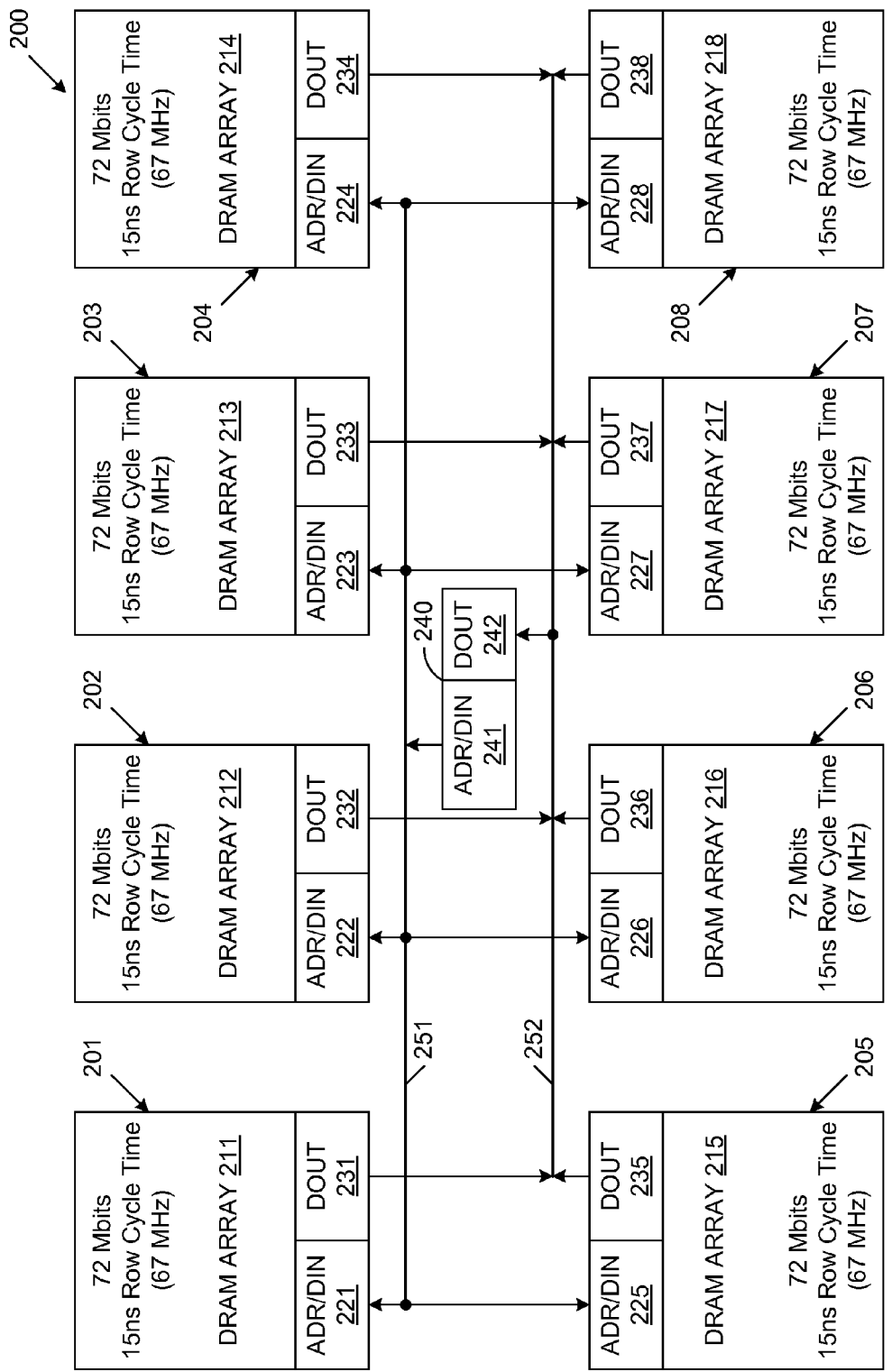
FIG. 2A is a block diagram of a conventional reduced-latency DRAM (RLDRAM) memory system that includes multiple banks.
Figure 2B:
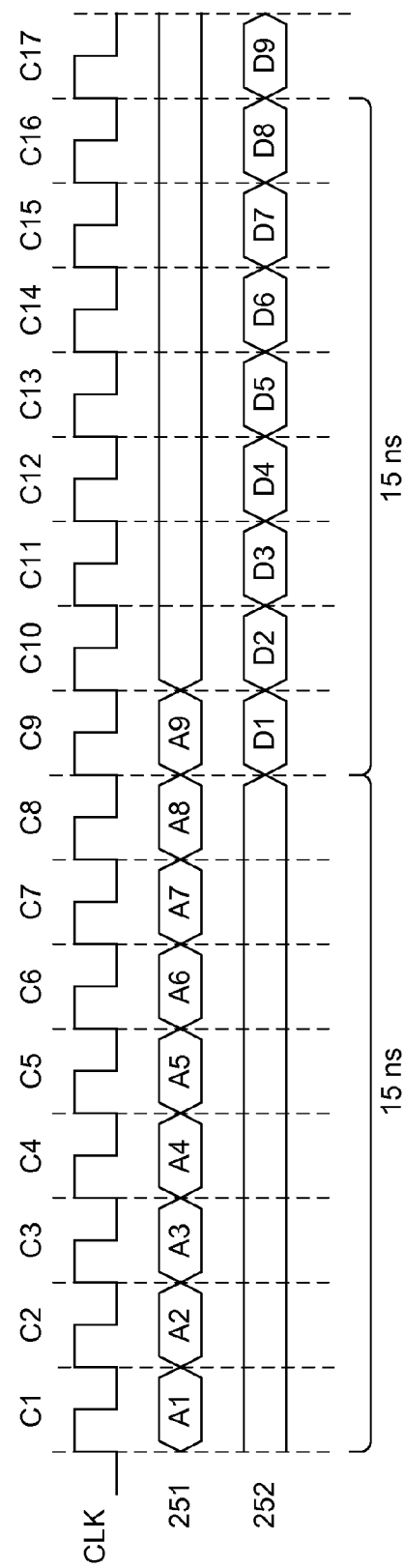
FIG. 2B is a waveform diagram illustrating the operation of the memory system of FIG. 2A.
Figure 3:
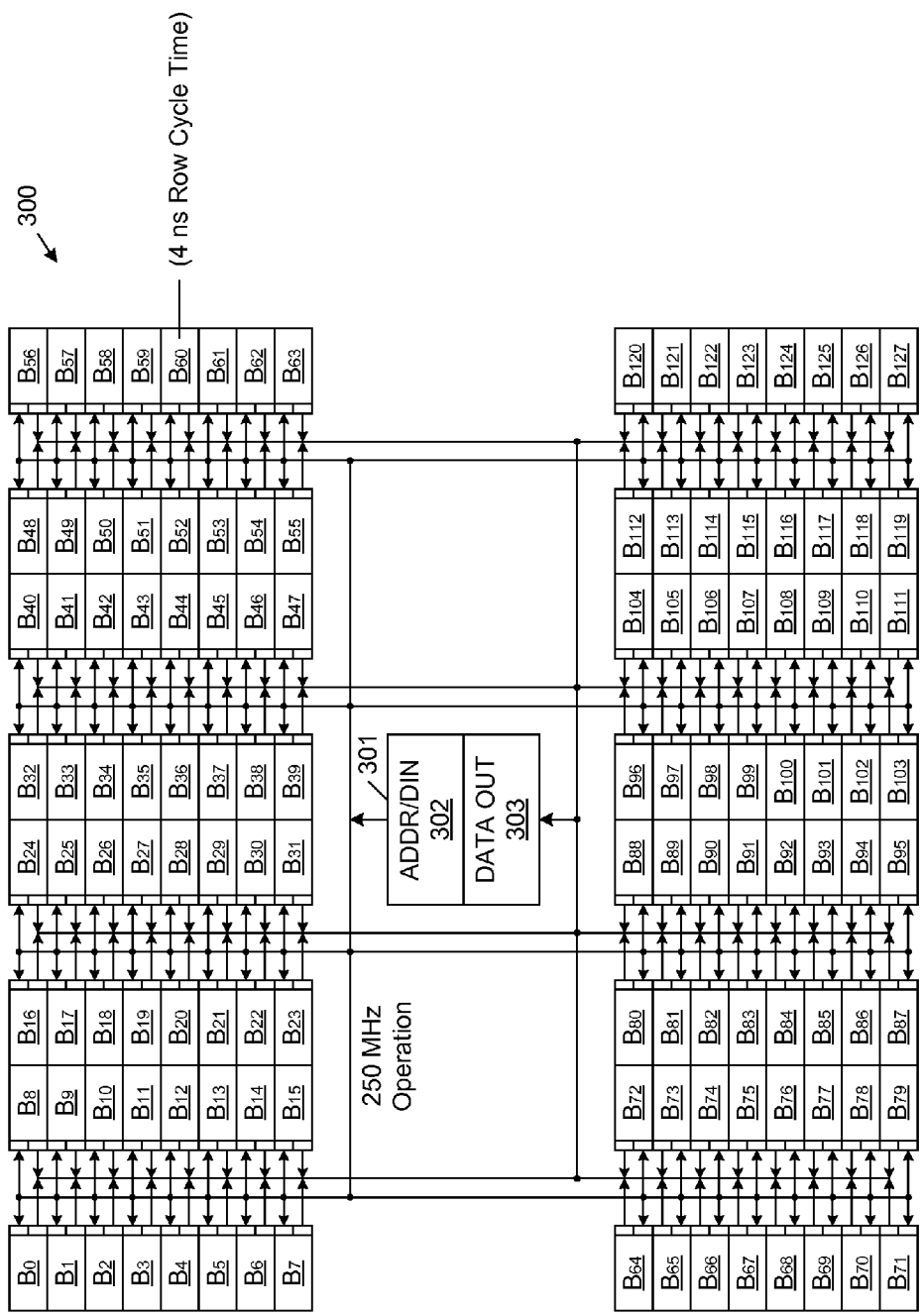
FIG. 3 is a block diagram of a conventional random access memory system that includes multiple banks.

As described above, each partition 401-404 operates at a frequency of 500 MHz (2 ns), thereby allowing central interface 420 to operate at a cyclic random transaction rate of 2 GHz. This represents an 8× improvement over memory system 300 (FIG. 3).

Figure 6:
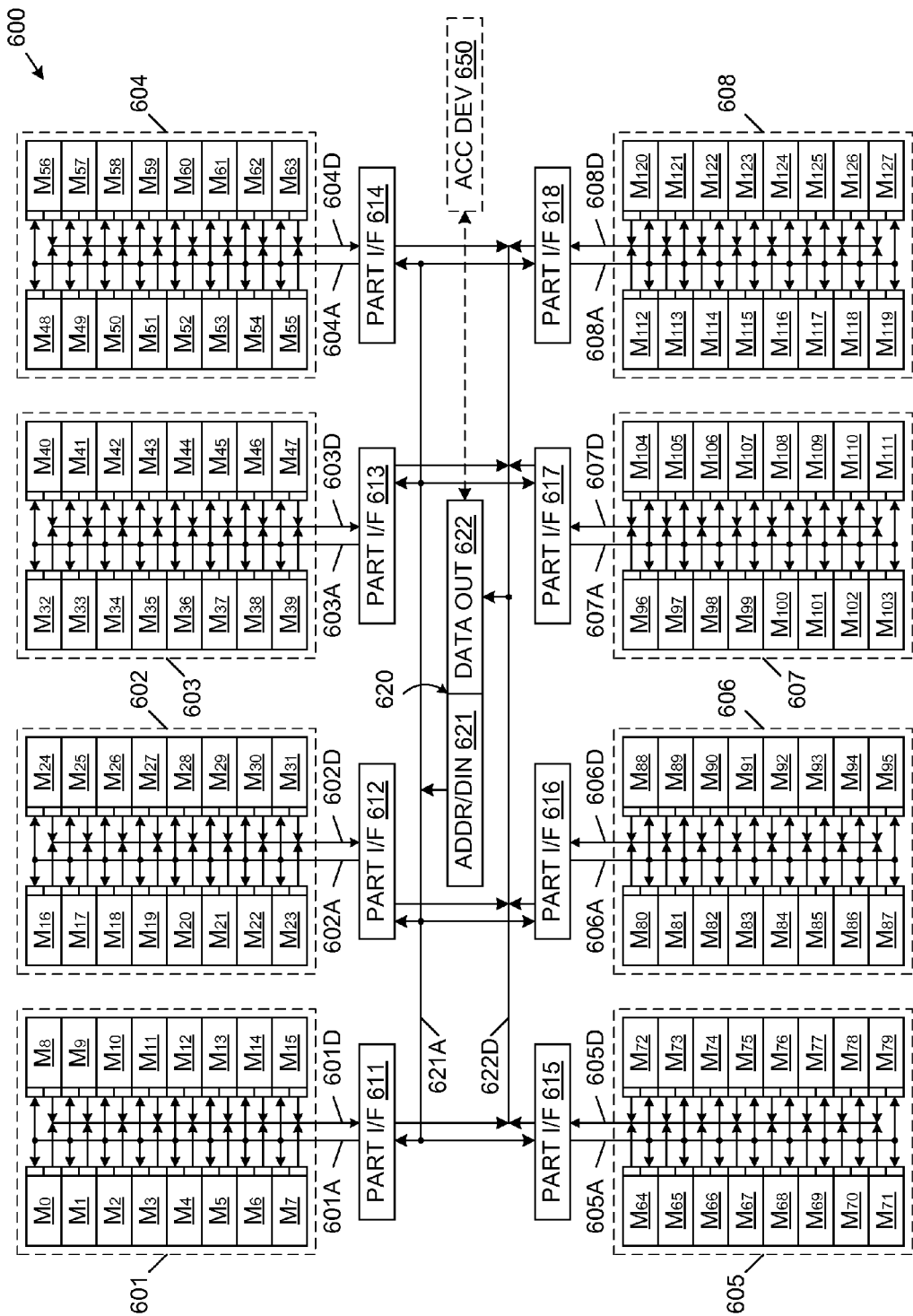
FIG. 6 is a block diagram of a memory system having one level of hierarchy in accordance with an alternate embodiment of the present invention.

FIG. 6 is a block diagram of a memory system 600 in accordance with an alternate embodiment of the present invention. Memory system 600 includes eight multi-bank partitions 601-608, eight partition interfaces 611-618, and a global interface 620 that includes global address/write data input block 621 and global data output block 622. Multi-bank partitions 601, 602, 603, 604, 605, 606, 607 and 608 include memory banks $M_0$-$M_{15}$, $M_{16}$-$M_{31}$, $M_{32}$-$M_{47}$, $M_{48}$-$M_{63}$, $M_{64}$-$M_{79}$, $M_{80}$-$M_{95}$, $M_{96}$-$M_{111}$, $M_{112}$-$M_{127}$, respectively. In the described examples, each of memory banks $M_0$-$M_{127}$ includes a 4.5 Mbit DRAM array that has a 4 ns row cycle time. That is, each of memory banks $M_0$-$M_{127}$ operates at a frequency of 250 MHz (i.e., 250 M transactions/sec). Each of the memory banks $M_0$-$M_{127}$ includes an address generation/write data input block and a data output block. The address generation/write data input blocks of the memory banks in multi-bank partitions 601-608 are coupled to local address/write data buses 601A-608A, respectively. Similarly, the data output blocks of the memory banks in multi-bank partitions 601-608 are coupled to local read data buses 601D-608D, respectively. The local address/write data buses 601A-608A and the local read data buses 601D-608D are operated a frequency of 250 MHz (i.e., at the same frequency as memory banks $M_0$-$M_{127}$).

Partition interfaces 611-618 are coupled to multi-bank partitions 601-608, respectively, by the local address/write data buses 601A-608A, respectively, and the local read data buses 601D-608D, respectively. Partition interfaces 611-618 are also coupled to the global interface 620 by a global address/write data bus 621A and a global read data bus 622D. The global address/write data bus 621A is coupled to address/write data generation block 621, and the global read data bus 622D is coupled to data output block 622. In the described examples, global address/write data bus 621A and global read data bus 622D operate at frequency of 2 GHz (i.e., 8 times the frequency of local buses 601A-608A and 601D-608D).

Memory system 600 is accessed by an external accessing device 650 at a frequency of 2 GHz. As described in more detail below, accessing device 650 accesses multi-bank partitions 601-608 in a cyclic random manner. That is, accessing device 650 accesses each of the multi-bank partitions 601-608 (at most) once every eight cycles of a 2 GHz clock signal.

Figure 7A:
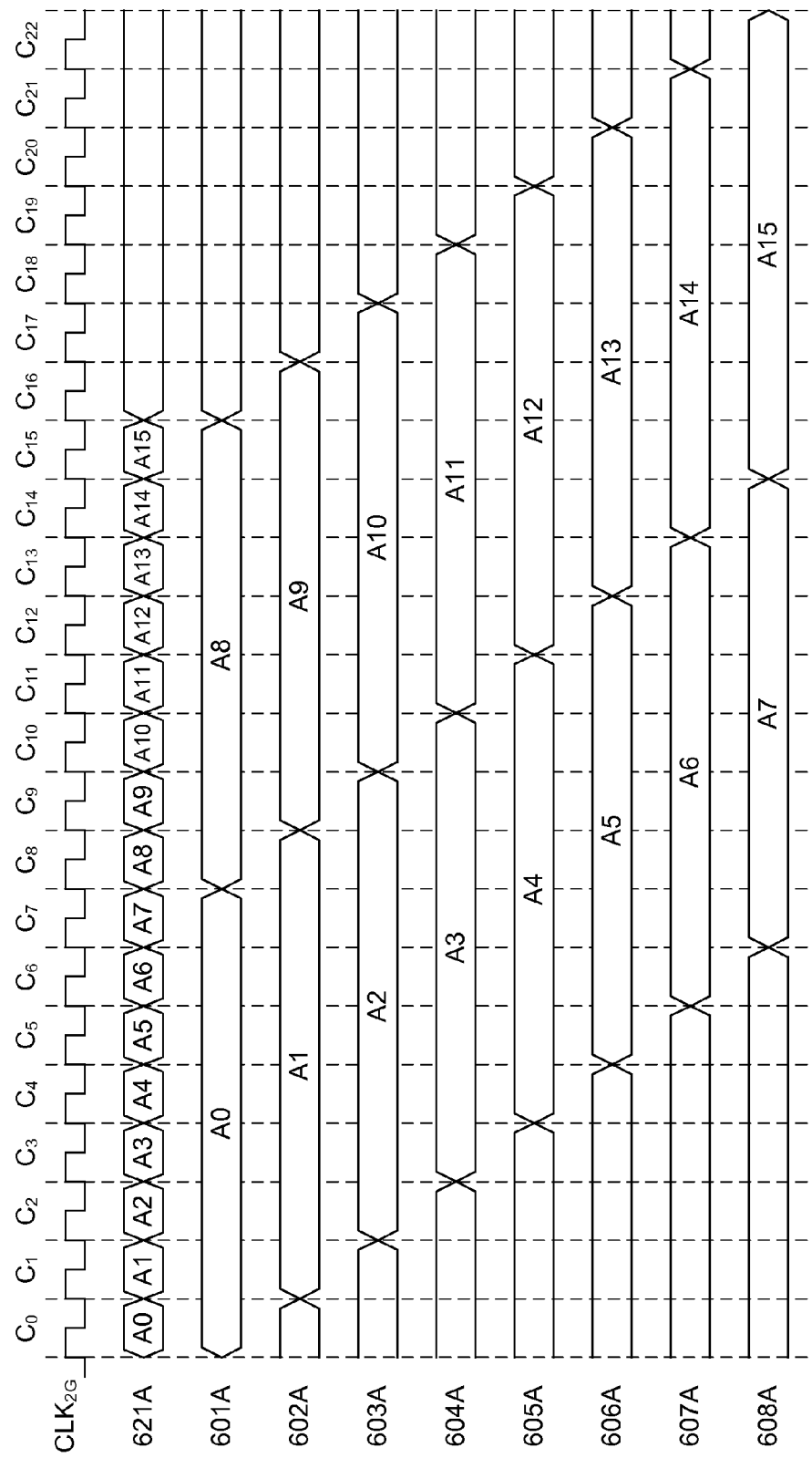
FIGS. 7A and 7B are waveform diagrams illustrating the operation of the memory system of FIG. 6 in accordance with one embodiment of the present invention.
Figure 7B:
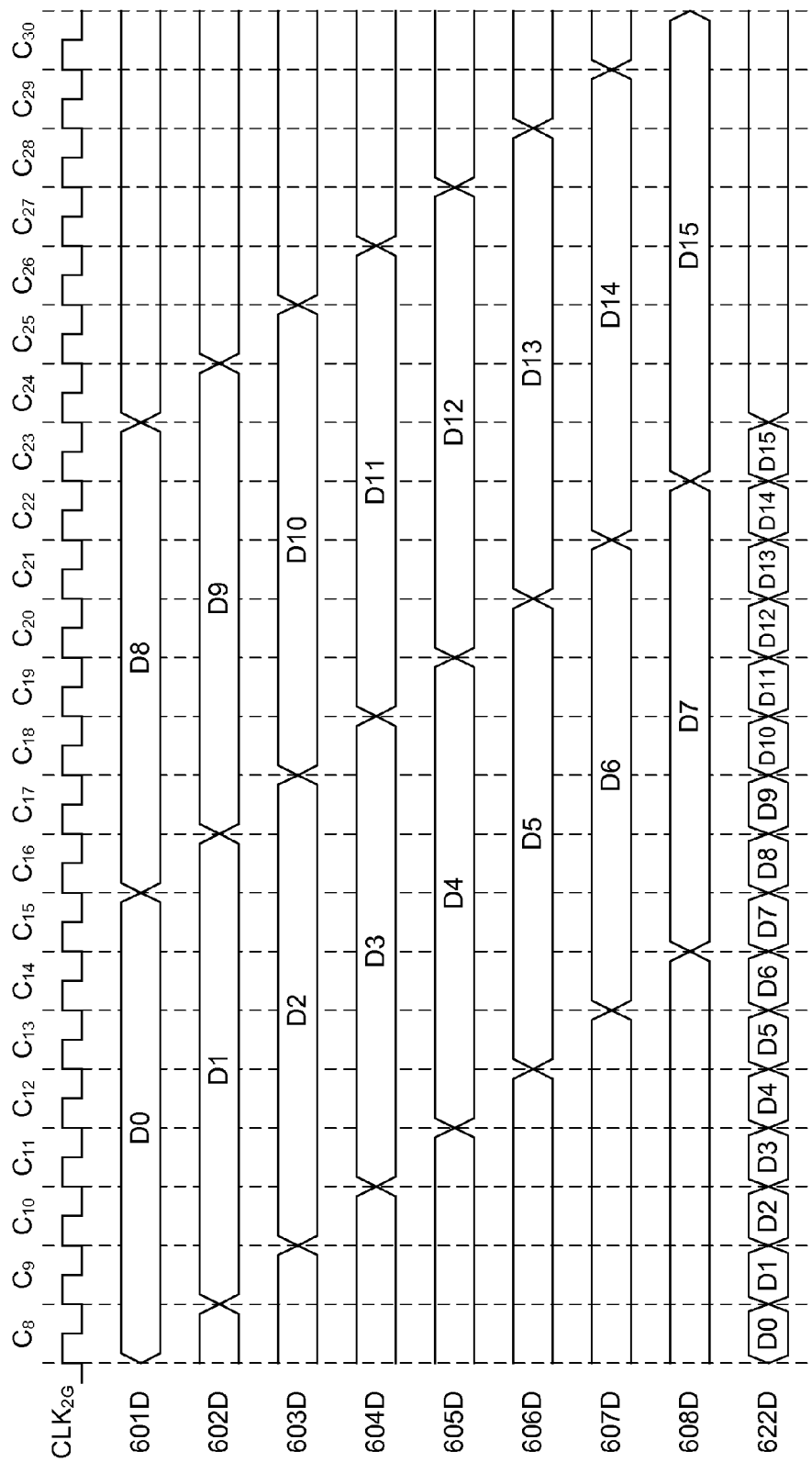

FIGS. 7A and 7B are waveform diagrams illustrating the operation of memory system 600 in accordance with one embodiment of the present invention. While the waveform diagram of FIGS. 7A and 7B illustrates cyclic random read transactions, it is understood that cyclic random write transactions could alternately be performed to memory system 600.

Global address generation block 621 provides read addresses A0-A15 on global address/write data bus 621A during corresponding cycles $C_0$-$C_{15}$ of a 2 GHz clock signal, $CLK_{2G}$. Read addresses A0-A7 specify memory banks within multi-bank partitions 601-608, respectively. Partition interfaces 611-618 determine that read addresses A0-A7 target the corresponding partitions 601-608, respectively, and in response, transmit the read addresses A0-A7 on the corresponding local address/write data buses 601A-608A, starting during cycles $C_0$-$C_7$, respectively, as illustrated in FIG. 7A.

Upon receiving the read addresses A0-A7, the memory banks specified by these read addresses perform read operations. As described above, each of the memory banks $M_0$-$M_{127}$ has a row cycle time of 4 ns, so the associated read data values D0-D7 are provided on local data output buses 601D-608D, starting during cycles $C_8$-$C_{15}$, respectively, as illustrated by FIG. 7B.

Read addresses A8-A15 specify memory banks within multi-bank partitions 601-608, respectively. The memory banks specified by read addresses A8-A15 may be the same or different than the memory banks specified by read addresses A0-A7. In the present embodiment, successive accesses to each partition need not specify different memory banks within the partition, because the partitions and the local buses operate at the same frequency (e.g., 250 MHz). Partition interfaces 611-618 determine that read addresses A8-A15 target the corresponding partitions 601-608, respectively, and in response, transmit the read addresses A8-A15 on the corresponding local address/write data buses 601A-608A, starting during cycles $C_8$-$C_{15}$, respectively, as illustrated by FIG. 7A.

Upon receiving the read addresses A8-A15, the memory banks specified by these read addresses perform read operations, such that the associated read data values D8-D15 are provided on local read data output buses 601D-608D, respectively, starting during cycles $C_{16}$-$C_{23}$, respectively, as illustrated by FIG. 7B.

Partition interfaces 611-618 receive the read data values provided on local read data buses 601D-608D. Upon receiving a new data value, each partition interface provides this new read data value on the global read data bus 622D for one cycle of the global clock signal $CLK_{2G}$. For example, partition interface 611 provides the read data values D0 and D8 on global read data bus 622D during cycles $C_8$ and $C_{16}$, respectively; and partition interface 602 provides the read data values D1 and D9 on global read data bus 622D during cycles $C_9$ and $C_{17}$, respectively. In this manner, the read data values D0-D15 are provided on the global read data bus 622D at a frequency of 2 GHz. Data output block 622 receives the read data values from global read data bus 622D, and provides these read data values to the accessing device 650 (at 2 GHz).

Although FIGS. 7A and 7B only show two cycles of accessing partitions 601-608, it is understood that partitions 601-608 could be continually accessed in the cyclic manner illustrated by FIGS. 7A and 7B.

Figure 8:
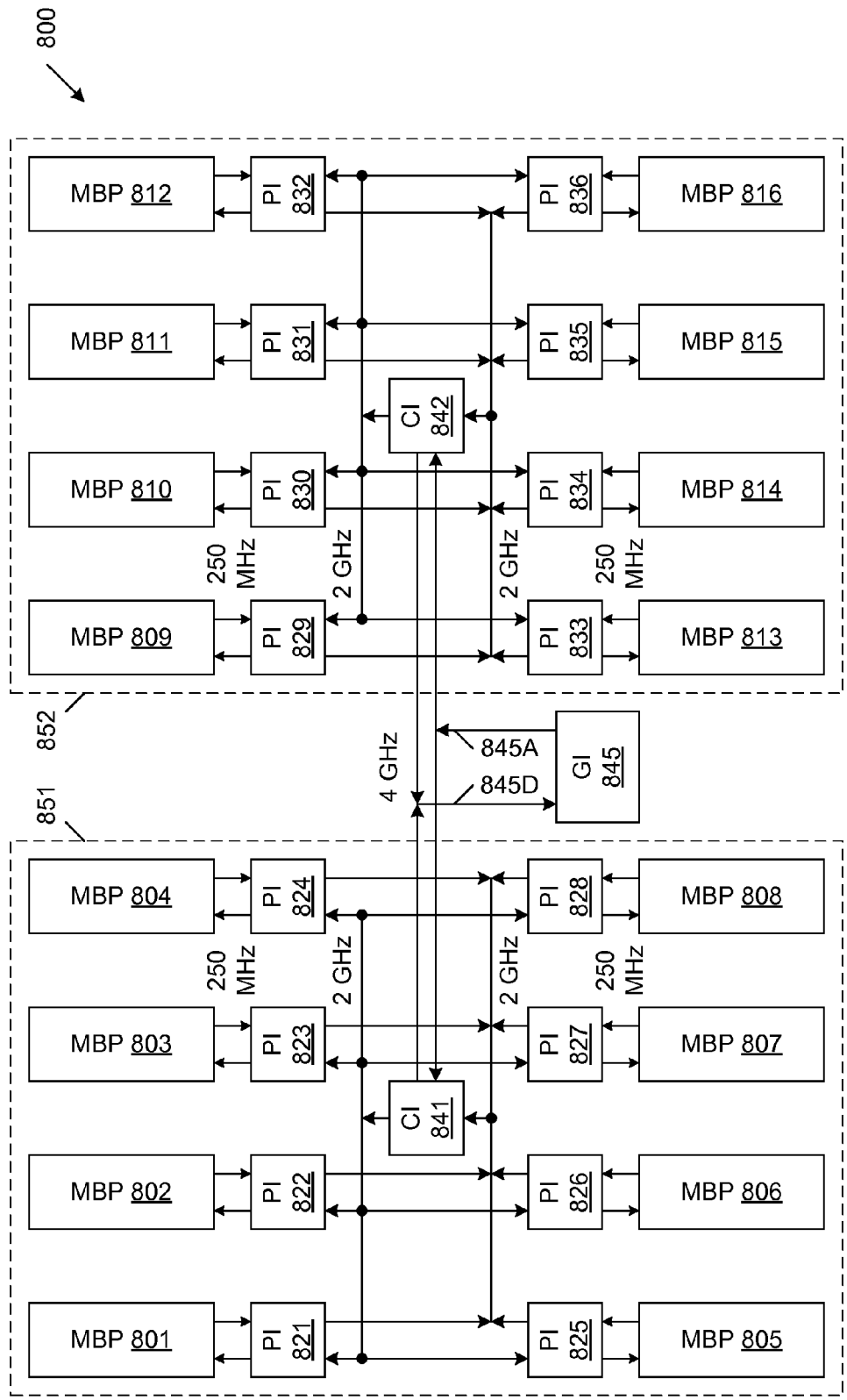
FIG. 8 is a block diagram of a memory system having two levels of hierarchy in accordance with yet another embodiment of the present invention.

FIG. 8 is a block diagram of a memory system 800 in accordance with yet another embodiment of the present invention. Memory system 800 includes two levels of hierarchy (whereas memory systems 400 and 600 only include one level of hierarchy). While the first level of hierarchy is defined herein as 'partitions', the second level of hierarchy is defined herein as 'clusters'. Memory system 800 includes two clusters 851 and 852. In the described embodiment, each of the clusters 851-852 is identical to memory system 600. Thus, cluster 851 includes eight multi-bank partitions 801-808 (which are identical to multi-bank partitions 601-608), eight partition interfaces 821-828 (which are identical to partition interfaces 611-618), and cluster interface 841 (which is identical to global interface 620). Similarly, cluster 852 includes eight multi-bank partitions 809-816 (which are identical to multi-bank partitions 601-608), eight partition interfaces 829-836 (which are identical to partition interfaces 611-618), and cluster interface 842 (which is identical to global interface 620).

Transactions between multi-bank partitions 801-816 and partition interfaces 821-836 are performed at a frequency of 250 Mhz, in the manner described above in connection with FIGS. 6 and 7A-7B. Similarly, transactions between partition interfaces 821-828 (829-836) and cluster interface 841 (842) are performed at a frequency of 2 GHz, in the manner described above in connection with FIGS. 6 and 7A-7B.

Transactions between global interface 845 and cluster interfaces 841-842 are performed at a frequency of 4 GHz. Note that read/write addresses are provided from global interface 845 to cluster interfaces 841-842 on global address/write data bus 845A (at a frequency of 4 GHz), and output data is provided from cluster interfaces 841-842 to global interface 845 on global read data output bus 845D (at a frequency of 4 GHz). Addresses provided by global interface 845 on bus 845A alternately specify cluster interfaces 841 and 842 (in an interleaved manner), thereby allowing cluster interfaces 841 and 842 to operate at 2 GHz each. Similarly, output data provided by cluster interfaces 841 and 842 (at 2 GHz) is alternately multiplexed onto global read data output bus 845D (in an interleaved manner), thereby allowing data to be transferred on global read data output bus 845D at a frequency of 4 GHz.

In the foregoing manner, memory system 800 provides maximum cyclic random transaction rate of 4 GHz. Advantageously, the frequency of operation of the individual banks in multi-bank partitions 801-816 remains at 250 MHz. Although memory system 800 includes two clusters of eight partitions each, it is understood that memory system 800 could be modified to include other numbers of clusters and/or partitions. For example, two additional clusters (having eight partitions each) could be added to memory system 800, thereby increasing the cyclic random transaction rate from 4 GHz to 8 GHz.

Although the examples described above in connection with FIGS. 4-8 use memory banks having a relatively fast 4 ns row cycle time, it is understood that the present invention can also be applied to memory banks having slower row cycle times. Several examples of memory systems that implement slower memory banks are described below.

Figure 9:
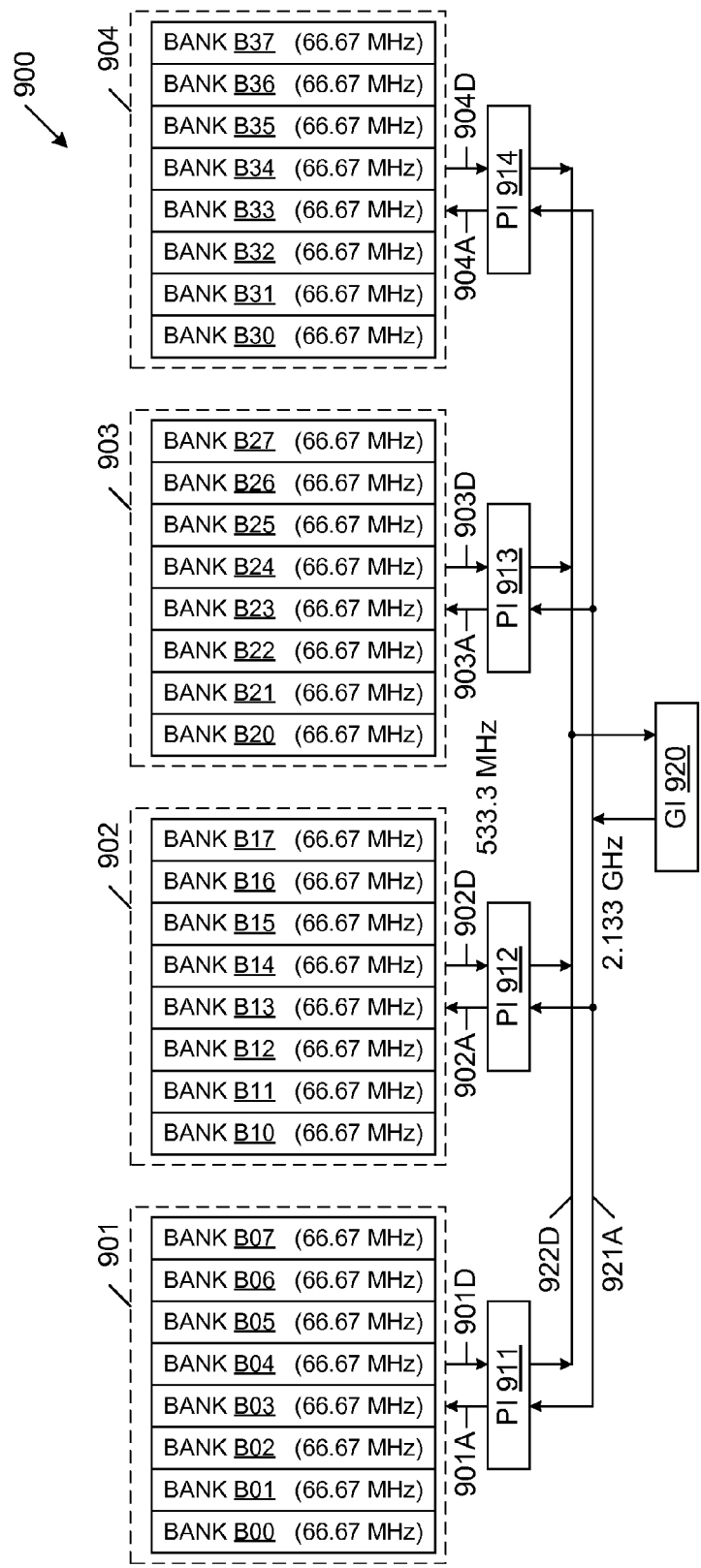
FIG. 9 is a block diagram of a memory system that implements a single level of hierarchy that includes four multi-bank partitions, in accordance with another embodiment of the present invention.

FIG. 9 is a block diagram of a memory system 900 that implements an additional level of hierarchy that includes four multi-bank partitions 901-904, four corresponding partition interfaces 911-914, and global interface 920. Multi-bank partitions 901, 902, 903 and 904 include memory banks B00-B07, B10-B17, B20-B27 and B30-B37, respectively. Each of these memory banks has a 15 ns row cycle time (i.e., 66.67 MHz operation).

The memory banks in multi-bank partitions 901, 902, 903 and 904 are coupled to partition interfaces 911, 912, 913 and 914, respectively, by local address/write data buses 901A, 902A, 903A and 904A, respectively, and local read data buses 901D, 902D, 903D and 904D, respectively. As described in more detail below, these local buses 901A-904A and 901D-904D are operated a frequency of 533 MHz (i.e., 8 times the frequency of the memory banks). As described in more detail below, each of the partition interfaces 911-914 accesses the banks of its corresponding multi-bank partition in an overlapping cyclic manner at a frequency of about 533 MHz (i.e., 66.67 MHz×8). Partition interfaces 911-914 are coupled to global interface 920 by a global address/write data bus 921A and a global read data bus 922D. As described in more detail below, global interface 920 accesses partitions interfaces 911-914 in a cyclic manner at a frequency of about 2.133 GHz (i.e., 533 MHz×4).

Figure 10A:
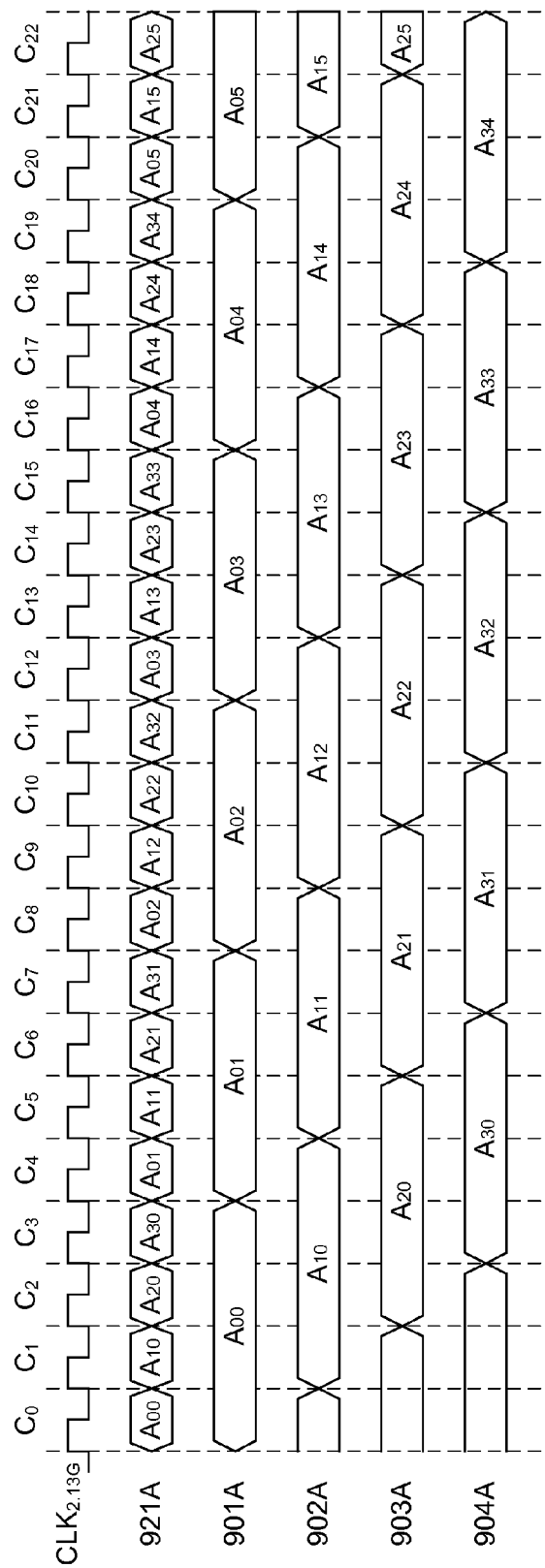
FIGS. 10A and 10B are waveform diagrams illustrating the operation of the memory system of FIG. 9 in accordance with one embodiment of the present invention.
Figure 10B:
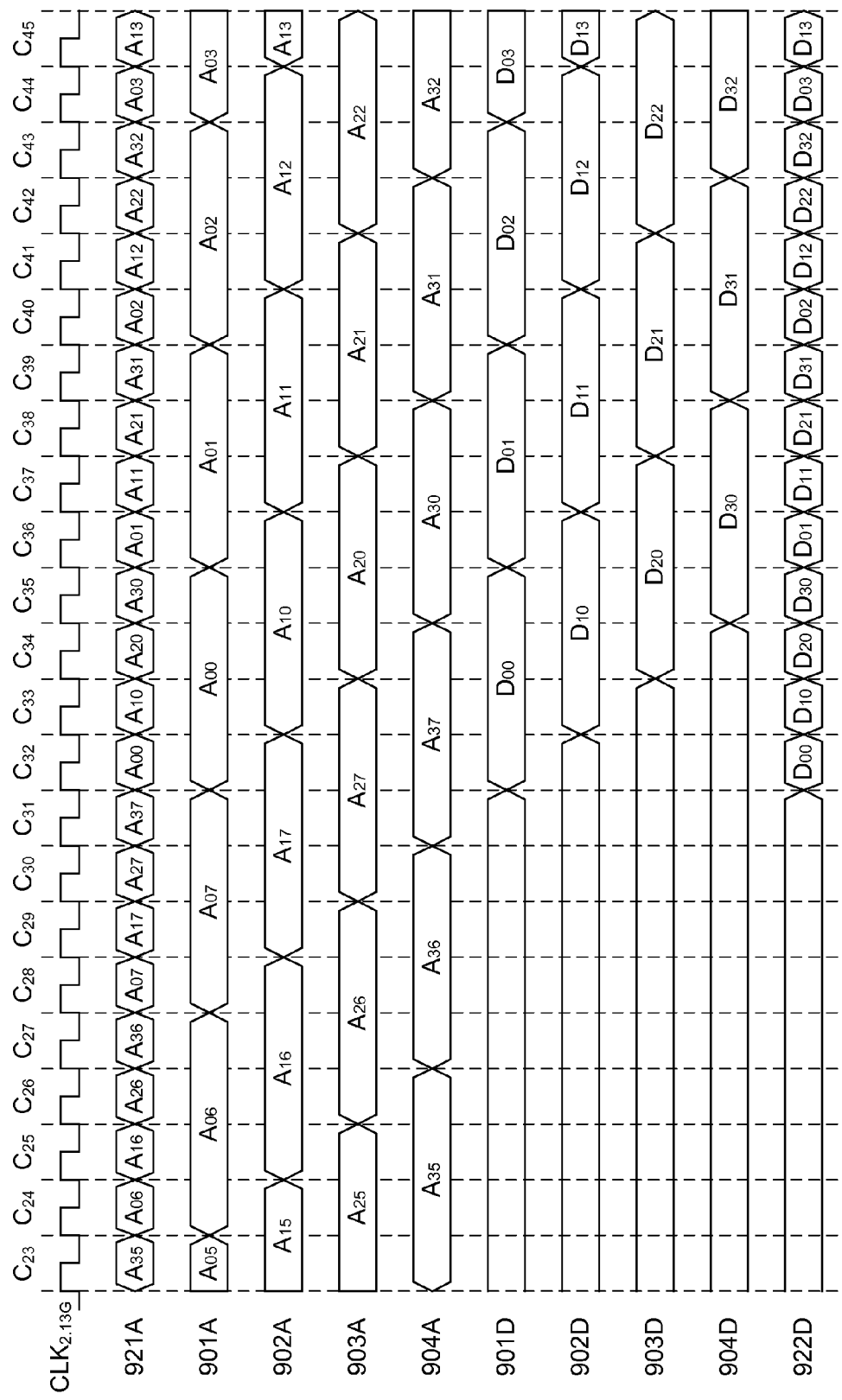

FIGS. 10A-10B illustrate the manner in which global interface 920 may access multi-bank partitions 901-904 in accordance with one embodiment of the present invention. Global interface 920 provides read addresses to partition interfaces 911-914 on global address/write data bus 921A as illustrated, during cycles $C_0$-$C_{45}$ of a 2.133 GHz clock signal ($CLK_{2.13G}$). In general, the read addresses are labeled $A_{XX}$, wherein the value 'XX' identifies the memory bank specified by the read address (e.g., read address $A_{00}$ specifies memory bank B00). Note that the read addresses on bus 921A specify a particular memory partition once every four cycles of the clock signal $CLK_{2.13G}$.

Partition interfaces 911, 912, 913 and 914 determine that read addresses $A_{0X}$, $A_{1X}$, $A_{2X}$ and $A_{3X}$ target the corresponding multi-bank partitions 901, 902, 903 and 904, respectively, and in response, transmit these read addresses $A_{0X}$, $A_{1X}$, $A_{2X}$ and $A_{3X}$ on the corresponding local address/write data buses 901A, 902A, 903A and 904A.

Upon receiving the read addresses $A_{0X}$, $A_{1X}$, $A_{2X}$ and $A_{3X}$, the memory banks specified by these read addresses perform read operations. The corresponding read data values $D_{0X}$, $D_{1X}$, $D_{2X}$ and $D_{3X}$ are provided on local data output buses 901D, 902D, 903D and 904D, 15 ns after the read operations are initiated. For example, read data value $D_{00}$ is provided on local output bus 901D during cycle $C_{32}$, in response to the read address $A_{00}$ provided during cycle $C_0$.

Partition interfaces 911-914 receive the read data values provided on local read data buses 901D-904D. Upon receiving a new data value, each partition interface provides this new data value on the global read data bus 922D for one cycle of the global clock signal $CLK_{2.13G}$. For example, partition interfaces 901-904 provide read data values D00, D10, D20 and D30 on global read data bus 922D during cycles $C_{32}$, $C_{33}$, $C_{34}$ and $C_{35}$, respectively. In this manner, the read data values are provided on the global read data bus 922D at a frequency of 2.133 GHz.

Figure 11:
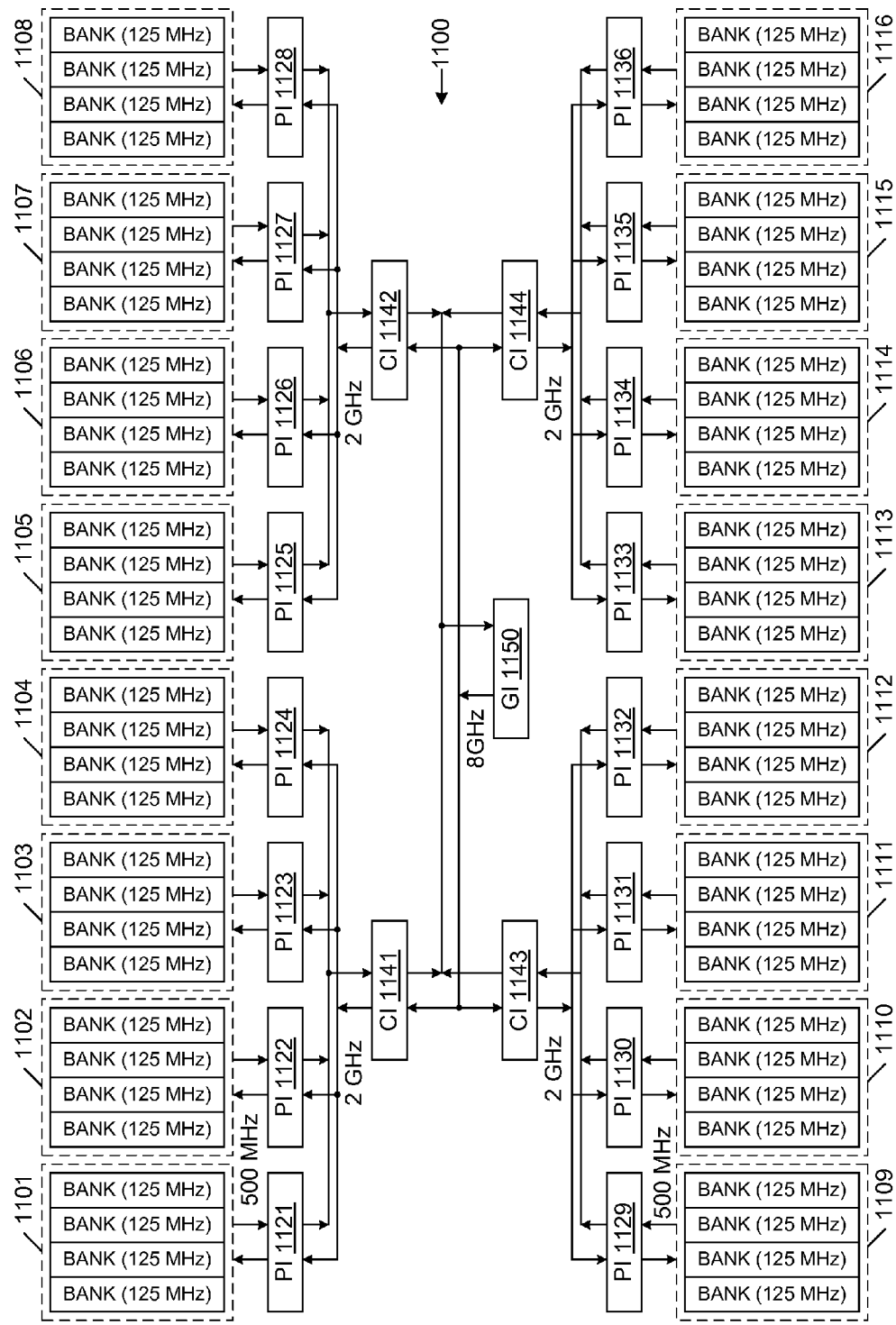
FIG. 11 is a block diagram of a memory system that implements two levels of hierarchy that includes four clusters of four partitions each, in accordance with another embodiment of the invention.

FIG. 11 is a block diagram of a memory system 1100 that implements two levels of hierarchy that includes four clusters of four partitions each. Memory system 1100 includes sixteen multi-bank partitions 1101-1116, each of which includes four memory banks, wherein each of the memory banks has an 8 ns row cycle time (i.e., 125 MHz operation). Partition interfaces 1121-1136 are coupled to multi-bank partitions 1101-1116, respectively. Each of the partition interfaces 1121-1136 accesses the banks of its corresponding multi-bank partition in a cyclic manner at a frequency of 500 MHz (i.e., 125 MHz×4). Partition interfaces 1121-1124, 1125-1128, 1129-1132 and 1133-1136 are coupled to cluster interfaces 1141, 1142, 1143 and 1144, respectively. Each of the cluster interfaces 1141-1144 accesses its corresponding partition interfaces in a cyclic manner at a frequency of 2 GHz (i.e., 500 MHz×4). Each of cluster interfaces 1141-1144 is coupled to global interface 1150. Global interface 1150 accesses cluster interfaces 1141-1144 in a cyclic manner at a frequency of 8 GHz (i.e., 2 GHz×4).

Although the invention has been described in connection with several embodiments, it is understood that this invention is not limited to the embodiments disclosed, but is capable of various modifications, which would be apparent to a person skilled in the art. For example, although the present invention has been described in connection with either one or two levels of hierarchy, it is understood that additional levels of hierarchy may be added as necessary to achieve the desired external access frequency. Accordingly, the present invention is limited only by the following claims.

I claim:

1. A memory system comprising:
   a plurality of partitions, each including a plurality of memory banks;
   a plurality of partition interfaces, wherein each of the partition interfaces controls accesses to a corresponding one of the partitions at a first frequency; and
   a global interface coupled to the partition interfaces, wherein the global interface controls accesses to the partition interfaces at a second frequency, which is faster than the first frequency, wherein the second frequency is equal to the first frequency times the number of partition interfaces.

2. The memory system of claim 1, wherein each of the partitions includes a local bus coupled to each of the plurality of memory banks of the partition, wherein the local bus operates at the first frequency.

3. The memory system of claim 2, wherein each of the plurality of memory banks operates at a third frequency, which is less than the first frequency.

4. The memory system of claim 3, wherein the first frequency is equal to the third frequency times the number of memory banks in each partition.

5. The memory system of claim 2, wherein each of the plurality of memory banks operates at the first frequency.

6. The memory system of claim 1, wherein the global interface is coupled to each of the plurality of partition interfaces by a global bus that operates at the second frequency.

7. A memory system comprising:
   a plurality of partitions, each including a plurality of memory banks;
   a plurality of partition interfaces, wherein each of the partition interfaces controls accesses to a corresponding one of the partitions at a first frequency;
   a plurality of cluster interfaces, wherein each of the cluster interfaces controls accesses to a corresponding group of the plurality of partition interfaces at a second frequency, which is faster than the first frequency; and
   a global interface coupled to each of the cluster interfaces, wherein the global interface controls accesses to the cluster interfaces at a third frequency, which is faster than the second frequency.

8. The memory system of claim 7, wherein each of the partitions includes a local bus coupled to each of the plurality of memory banks of the partition, wherein the local bus operates at the first frequency.

9. The memory system of claim 8, wherein each of the plurality of memory banks operates at a fourth frequency, which is less than the first frequency.

10. The memory system of claim 8, wherein each of the plurality of memory banks operates at the first frequency.

11. The memory system of claim 7, wherein the second frequency is equal to the first frequency times the number of partition interfaces, and the third frequency is equal to the second frequency times the number of cluster interfaces.

12. A method of operating a memory system comprising:
   accessing a plurality of multi-bank partitions through a corresponding plurality of partition interfaces, wherein each of the partition interfaces accesses a corresponding one of the multi-bank partitions at a first frequency; and
   accessing the plurality of partition interfaces through a global interface, wherein the global interface accesses the plurality of partition interfaces at a second frequency that is faster than the first frequency, wherein the second frequency equals the first frequency times the number of partition interfaces.

13. The method of claim 12, wherein the partition interfaces access the multi-bank partitions in a cyclic manner, and the global interface accesses the partition interfaces in a cyclic manner.

14. The method of claim 12, further comprising performing accesses within individual memory banks within the multi-bank partitions at a third frequency, which is slower than the first frequency.

15. The method of claim 12, further comprising performing accesses within individual memory banks within the multi-bank partitions at the first frequency.

16. A method of operating a memory system comprising:
    accessing a plurality of multi-bank partitions through a corresponding plurality of partition interfaces, wherein each of the partition interfaces accesses a corresponding one of the multi-bank partitions at a first frequency;
    accessing the plurality of partition interfaces through a plurality of cluster interfaces, wherein each of the cluster interfaces accesses a corresponding plurality of the partition interfaces at a second frequency that is faster than the first frequency; and
    accessing the plurality of cluster interfaces through a global interface, wherein the global interface accesses the plurality of cluster interfaces at a third frequency that is faster than the second frequency.

17. The method of claim 16, wherein the partition interfaces access the multi-bank partitions in a cyclic manner, the cluster interfaces access the partition interfaces in a cyclic manner, and the global interface accesses the cluster interfaces in a cyclic manner.

18. The method of claim 16, further comprising performing accesses within individual memory banks within the multi-bank partitions at a fourth frequency, which is slower than the first frequency.

\* \* \* \* \*